US012804829B2

(12) United States Patent
Yun et al.

(10) Patent No.: US 12,804,829 B2

(45) Date of Patent: Nov. 17, 2026

(54) ELECTRONIC DEVICE INCLUDING CONNECTOR MEMBER

(71) Applicant: Samsung Electronics Co., Ltd., Suwon-si (KR)

(72) Inventors: Inkuk Yun, Suwon-si (KR); Jungjin Kim, Suwon-si (KR); Minwoo Yoo, Suwon-si (KR); Yongsang Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 583 days.

(21) Appl. No.: 18/015,405

(22) PCT Filed: Jun. 18, 2021

(86) PCT No.: PCT/KR2021/007674

§ 371 (c)(1),
(2) Date: May 10, 2023

(87) PCT Pub. No.: WO2021/256892

PCT Pub. Date: Dec. 23, 2021

(65) Prior Publication Data

US 2023/0269893 A1 Aug. 24, 2023

(30) Foreign Application Priority Data

Jun. 19, 2020 (KR) ........................ 10-2020-0075257

(51) Int. Cl.

| | |
|---|---|
| ***H05K 5/02*** | (2006.01) |
| ***H01Q 1/22*** | (2006.01) |
| ***H05K 7/14*** | (2006.01) |

(52) U.S. Cl.

CPC ............ *H05K 5/0226* (2013.01); *H01Q 1/22* (2013.01); *H05K 7/1427* (2013.01)

(58) Field of Classification Search

CPC ....... H05K 5/0226; H05K 7/1427; H01Q 1/22

See application file for complete search history.

(56) References Cited

U.S. PATENT DOCUMENTS 5,281,765 A * 1/1994 Iura ...................... H01B 7/0838 174/71 R 5,542,104 A * 7/1996 Ozawa ............... H04B 7/18571 343/702

(Continued)

FOREIGN PATENT DOCUMENTS

CN 102150099 A 8/2011

CN 105980955 A 9/2016

(Continued)

OTHER PUBLICATIONS

Chinese Office Action dated Jan. 20, 2025, issued in Chinese Patent Application No. 202180050755.0.

(Continued)

*Primary Examiner* — Allen L Parker

*Assistant Examiner* — Douglas R Burtner

(74) *Attorney, Agent, or Firm* — Jefferson IP Law, LLP

(57) ABSTRACT

An electronic device is provided. The electronic device includes a flexible display, a first housing, a first hinge which is connected to the side surface of the first housing, and which can be folded in a first rotation direction and unfolded in a second rotation direction, a second housing connected to the first hinge, a second hinge which is connected to a side surface of the second housing, and which can be folded in the second rotation direction and unfolded in the first rotation direction, a third housing connected to the second hinge, a circuit board which is positioned inside the first housing and which includes a communication circuit, at least one antenna positioned inside the third housing, and a (Continued)

connection member for electrically connecting the circuit board and the antenna module.

15 Claims, 17 Drawing Sheets

(56) References Cited

U.S. PATENT DOCUMENTS

| | | | | |
|---|---|---|---|---|
| 6,308,377 | B1 * | 10/2001 | Maatta | H05K 5/0226 16/342 |
| 6,753,788 | B1 * | 6/2004 | Munyon | G09G 3/32 340/815.45 |
| 8,422,214 | B2 * | 4/2013 | Furumatsu | H04M 1/0216 361/679.28 |
| 8,718,724 | B2 * | 5/2014 | Fuke | H04M 1/18 455/575.3 |
| 9,195,358 | B1 * | 11/2015 | Cok | H05K 1/148 |
| 9,252,480 | B2 * | 2/2016 | Chiu | H01Q 7/00 |
| 9,535,465 | B2 * | 1/2017 | Bohn | H04M 1/022 |
| 10,108,224 | B2 * | 10/2018 | Tsubaki | E05D 7/00 |
| 10,365,687 | B2 * | 7/2019 | Kim | G06F 1/1637 |
| 11,901,610 | B2 * | 2/2024 | Kim | H04B 1/40 |
| 12,216,498 | B2 * | 2/2025 | Gu | H05K 1/18 |
| 12,294,139 | B2 * | 5/2025 | Park | H01Q 1/2266 |
| 2005/0272312 | A1 * | 12/2005 | Hashiguchi | H01R 12/775 439/578 |
| 2006/0146488 | A1 * | 7/2006 | Kimmel | G06F 1/1652 361/679.04 |
| 2009/0244835 | A1 * | 10/2009 | Matsushima | H04M 1/0277 361/679.55 |
| 2010/0064244 | A1 | 3/2010 | Kilpatrick, II et al. | |
| 2010/0085382 | A1 | 4/2010 | Lundqvist et al. | |
| 2010/0319972 | A1 * | 12/2010 | Watanabe | H05K 1/118 156/60 |
| 2012/0307472 | A1 * | 12/2012 | Bohn | G06F 1/1652 361/807 |
| 2012/0314399 | A1 * | 12/2012 | Bohn | H04M 1/0268 361/679.01 |
| 2013/0010405 | A1 | 1/2013 | Rothkopf et al. | |
| 2013/0086508 | A1 | 4/2013 | Oguz | |
| 2013/0094161 | A1 * | 4/2013 | Ochi | H01Q 1/52 361/752 |
| 2014/0055468 | A1 * | 2/2014 | Tomita | G06F 1/1624 345/520 |
| 2015/0227224 | A1 | 8/2015 | Park et al. | |
| 2015/0248149 | A1 | 9/2015 | Yamazaki et al. | |
| 2017/0290184 | A1 * | 10/2017 | Kim | H04M 1/0277 |
| 2017/0315589 | A1 | 11/2017 | Isa et al. | |
| 2017/0346164 | A1 * | 11/2017 | Kim | H04M 1/0266 |
| 2018/0160968 | A1 * | 6/2018 | Baltay | A61B 5/002 |
| 2019/0041907 | A1 * | 2/2019 | Kim | G06F 1/1618 |
| 2019/0212781 | A1 | 7/2019 | Fujimoto | |
| 2019/0320048 | A1 | 10/2019 | Yang et al. | |
| 2019/0369668 | A1 * | 12/2019 | Kim | G06F 1/1616 |
| 2020/0051468 | A1 | 2/2020 | Jung et al. | |
| 2020/0125138 | A1 * | 4/2020 | Lim | G06F 1/1698 |
| 2020/0183465 | A1 * | 6/2020 | Yoo | H01Q 1/2258 |
| 2020/0267839 | A1 * | 8/2020 | Woo | G06F 1/1616 |
| 2021/0168227 | A1 * | 6/2021 | Jung | H04M 1/0245 |
| 2021/0216104 | A1 | 7/2021 | Huang et al. | |
| 2021/0328329 | A1 | 10/2021 | Kim et al. | |
| 2021/0344783 | A1 | 11/2021 | Jeong et al. | |
| 2022/0061175 | A1 | 2/2022 | Oh et al. | |
| 2022/0321683 | A1 * | 10/2022 | Luo | H04M 1/0268 |
| 2023/0021614 | A1 * | 1/2023 | Park | H01Q 1/2266 |
| 2023/0048823 | A1 * | 2/2023 | Cho | H04M 1/0216 |
| 2023/0100675 | A1 * | 3/2023 | Gu | G06F 1/1641 361/679.27 |
| 2023/0156944 | A1 * | 5/2023 | Park | H05K 1/148 361/749 |
| 2023/0189463 | A1 * | 6/2023 | Woo | H04M 1/0216 361/749 |
| 2025/0031308 | A1 * | 1/2025 | Jung | G06F 1/1656 |
| 2025/0169003 | A1 * | 5/2025 | Kwon | H04M 1/0216 |
| 2025/0185193 | A1 * | 6/2025 | Cho | G06F 1/263 |
| 2026/0129774 | A1 * | 5/2026 | Jeon | G06F 1/1652 |

FOREIGN PATENT DOCUMENTS

| | | | |
|---|---|---|---|
| CN | 208384912 | U | 1/2019 |
| CN | 109917858 | A | 6/2019 |
| CN | 110830618 | A | 2/2020 |
| CN | 111147630 | A | 5/2020 |
| EP | 3 557 852 | A1 | 10/2019 |
| EP | 3 883 221 | A1 | 9/2021 |
| JP | 2005-295593 | A | 10/2005 |
| JP | 2010-252058 | A | 11/2010 |
| KR | 10-2001-0045624 | A | 6/2001 |
| KR | 10-2010-0009842 | A | 1/2010 |
| KR | 10-2016-0127026 | A | 11/2016 |
| KR | 10-2017-0100749 | A | 9/2017 |
| KR | 10-2019-0062107 | A | 6/2019 |
| KR | 10-2020-0024500 | A | 3/2020 |
| KR | 10-2020-0025439 | A | 3/2020 |
| WO | 2018/110749 | A1 | 6/2018 |
| WO | 2019/227296 | A1 | 12/2019 |
| WO | 2020/122598 | A1 | 6/2020 |

OTHER PUBLICATIONS

Korean Office Action dated Jul. 18, 2024, issued in Korean Patent Application No. 10-2020-0075257.
Extended European Search Report dated Nov. 27, 2023, issued in European Patent Application No. 21826350.7.
Korean Office Action dated Mar. 25, 2025, issued in a Korean Patent Application No. 10-2020-0075257.
Indian Examination Report dated Jun. 17, 2025, issued in Indian Patent Application No. 202317003168.
Chinese Notice of Allowance dated Jun. 30, 2025, issued in Chinese Patent Application No. 2021800507550.

* cited by examiner

ELECTRONIC DEVICE INCLUDING CONNECTOR MEMBER

CROSS-REFERENCE TO RELATED APPLICATION(S)

This application is a U.S. National Stage application under 35 U.S.C. § 371 of an International application No. PCT/KR2021/007674, filed on Jun. 18, 2021, which is based on and claims the benefit of a Korean patent application number 10-2020-0075257, filed on Jun. 19, 2020, in the Korean Intellectual Property Office, the disclosure of which is incorporated by reference herein in its entirety.

BACKGROUND

1. Field

The disclosure relates to an electronic device including a housing which is foldable twice.

2. Description of Related Art

As mobile communication services are extended to the multimedia service area, users may use multimedia services as well as voice calls or short messages through electronic devices. To enable users to use multimedia services without any inconvenience, electronic devices are increasingly equipped with large display panels. In addition, foldable electronic devices with flexible display panels disposed thereon have recently been disclosed.

For example, in regard to electronic devices including a flexible display disposed lying across two housings with respect to a hinge structure, an in-foldable electronic device in which two display areas face each other when folded and an out-foldable electronic device in which two display areas face in opposite directions when folded are disclosed.

Besides, an electronic device which is both in-foldable and out-foldable is disclosed. An electronic device with one flexible display foldable twice to provide information to a user through substantially three display areas is also disclosed.

The above information is presented as background information only to assist with an understanding of the disclosure. No determination has been made, and no assertion is made, as to whether any of the above might be applicable as prior art with regard to the disclosure.

SUMMARY

In the case where a wiring distance between a communication module (radio frequency integrated circuit (RFIC)) and a farthest antenna (e.g., fifth generation (5G) millimeter wave (mmWave) antenna) becomes greater due to an increased size of a terminal such as a foldable device implementing a large screen, it may be difficult to secure the integrity of a communication signal. For example, this is because the intermediate frequency (IF) loss value of a printed circuit board (PCB) wiring is large.

Accordingly, according to various embodiments of the disclosure, the integrity of a communication signal may be achieved by securing a wiring structure and a hinge structure for the wiring structure, which minimize radio frequency (RF) signal loss from an antenna RFIC to an antenna (e.g., a 5G mmWave antenna) in an electronic device including a structure that is foldable twice or more times.

Aspects of the disclosure are to address at least the above-mentioned problems and/or disadvantages and to provide at least the advantages described below. Accordingly, an aspect of the disclosure is to provide an electronic device.

Additional aspects will be set forth in part in the description which follows and, in part, will be apparent from the description, or may be learned by practice of the presented embodiments.

In accordance with an aspect of the disclosure, an electronic device is provided. The electronic device includes a flexible display, a first housing including a first surface facing in a first direction, and a second surface facing in a second direction opposite to the first direction, wherein the flexible display is located on the first surface, a first hinge connected to a side surface of the first housing is adapted to fold in a first rotation direction, and unfold in a second rotation direction, a second housing connected to the first hinge and including a third surface facing in a third direction and a fourth surface facing in a fourth direction, wherein the flexible display is located on the third surface, a second hinge connected to a side surface of the second housing is adapted to fold in a third rotation direction, and unfold in a fourth rotation direction, a third housing connected to the second hinge and including a fifth surface facing in a fifth direction and a sixth surface facing in a sixth direction, wherein the flexible display is located on the fifth surface, a circuit board located inside the first housing and including a communication circuit, at least one antenna located inside the third housing, and a connection member electrically connecting the circuit board to the antenna. The connection member includes a first connection member having a first physical property in the first hinge, and a second connection member having a second physical property in the second hinge.

An electronic device includes a flexible display, a first housing including a first surface facing in a first direction, a second surface facing in a second direction opposite to the first direction, a first side surface between the first surface and the second surface, and a second side surface facing in a direction opposite to the first side surface, wherein the flexible display is located on the first surface, a first hinge connected to the second side surface of the first housing is adapted to fold in a first rotation direction, and unfold in a second rotation direction, a second housing including a third surface facing in a third direction, a fourth surface facing in a fourth direction, a third side surface connected to the first hinge, and a fourth side surface facing in a direction opposite to the third side surface, wherein the flexible display is located on the third surface, a second hinge connected to the fourth side surface of the second housing is adapted to fold in a third rotation direction, and unfold in a fourth rotation direction, a third housing including a fifth surface facing in a fifth direction, a sixth surface facing in a sixth direction, a fifth side surface connected to the second hinge, and a sixth side surface facing in a direction opposite to the fifth side surface, wherein the flexible display is located on the fifth surface, a circuit board located inside the first housing and including a communication circuit, at least one antenna located adjacent to the sixth side surface inside the third housing, and a connection member electrically connecting the circuit board to the antenna. The connection member includes a first connection member having a first physical property in the first hinge, and a second connection member having a second physical property in the second hinge.

An electronic device includes a flexible display, a first housing including a first surface facing in a first direction and a second surface facing in a second direction opposite to the first direction, wherein the flexible display is located on the first surface, a first hinge connected to a side surface of the first housing is adapted to fold in a first rotation direction, and unfold in a second rotation direction, a second housing connected to the first hinge and including a third surface facing in a third direction and a fourth surface facing in a fourth direction, wherein the flexible display is located on the third surface, a second hinge connected to a side surface of the second housing is adapted to fold in a third rotation direction, and unfold in a fourth rotation direction, a third housing connected to the second hinge and including a fifth surface facing in a fifth direction and a sixth surface facing in a sixth direction, wherein the flexible display is located on the fifth surface, a circuit board located inside the first housing and including a communication circuit, at least one antenna located inside the third housing, a coaxial cable electrically connecting the circuit board to the antenna, a first fixing member to fix the coaxial cable to the first housing located at a side of the first hinge, a second fixing member to fix the coaxial cable to the second housing located at the side of the first hinge, a third fixing member to fix the coaxial cable to the second housing located at a side of the second hinge, and a fourth fixing member to fix the coaxial cable to the third housing located at the side of the second hinge.

According to various embodiments of the disclosure, the integrity of a communication signal may be achieved by securing a wiring structure and a hinge structure for the wiring structure, which minimize RF signal loss from a communication circuit to an antenna (e.g., a 5G mmWave antenna) in an electronic device including a structure that is foldable twice or more times.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, like reference numerals will be understood to refer to like parts, components, and structures.

DESCRIPTION OF REFERENCE NUMERALS IN THE DRAWINGS

Figure 1:
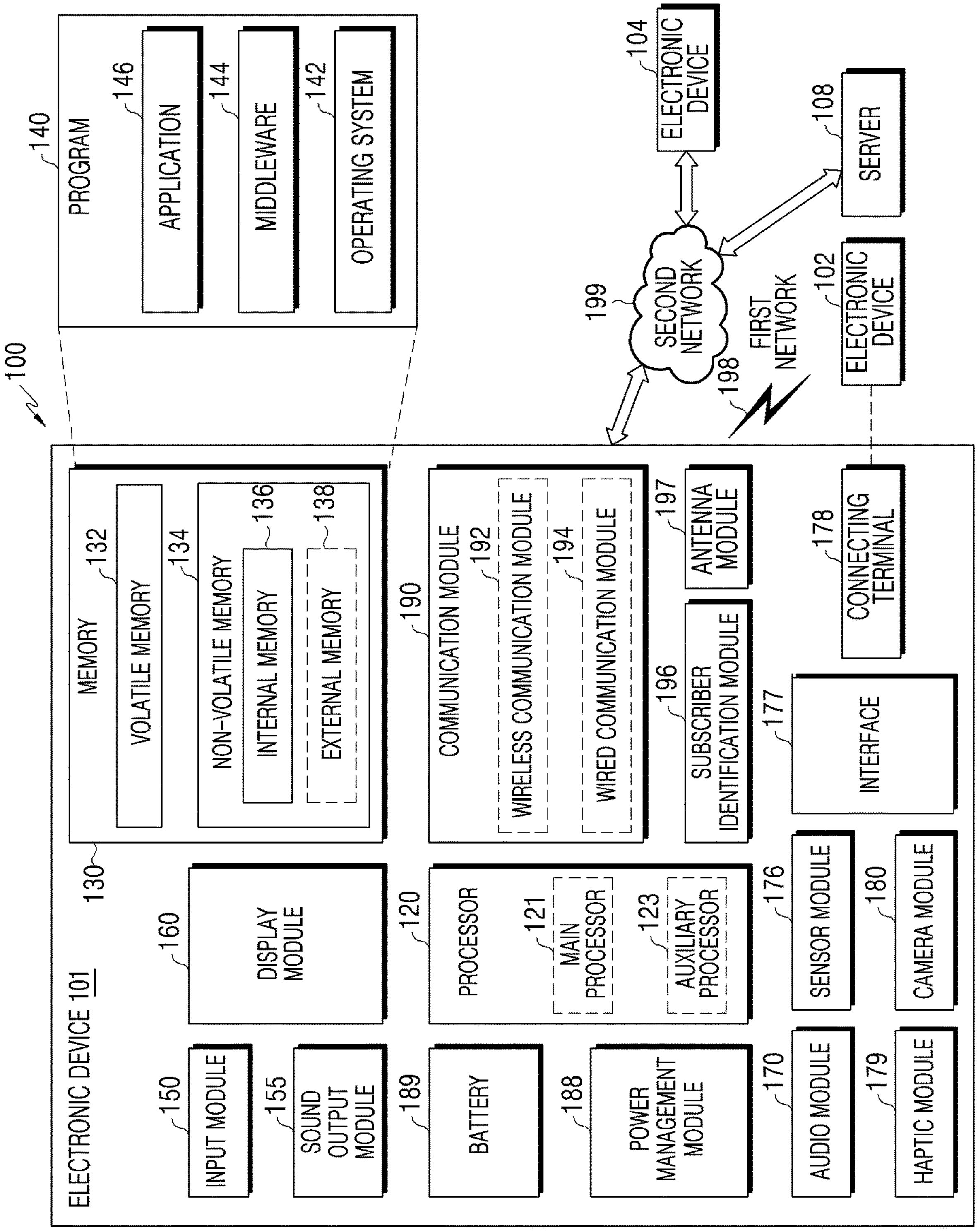
FIG. 1 is a block diagram illustrating an electronic device in a network environment according to an embodiment of the disclosure.

101: electronic device
200: display
201: first display (or first display area)
202: second display (or second display area)
203: third display (or third display area)
300: foldable housing
310: first housing
311: first surface
312: second surface
320: second housing
321: third surface
322: fourth surface
330: third housing
340: first hinge
350: second hinge

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms “a,” “an,” and “the” include plural referents unless the context clearly dictates otherwise. Thus, for example, reference to “a component surface” includes reference to one or more of such surfaces.

FIG. 1 is a block diagram illustrating an electronic device 101 in a network environment 100 according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the displays, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2A:
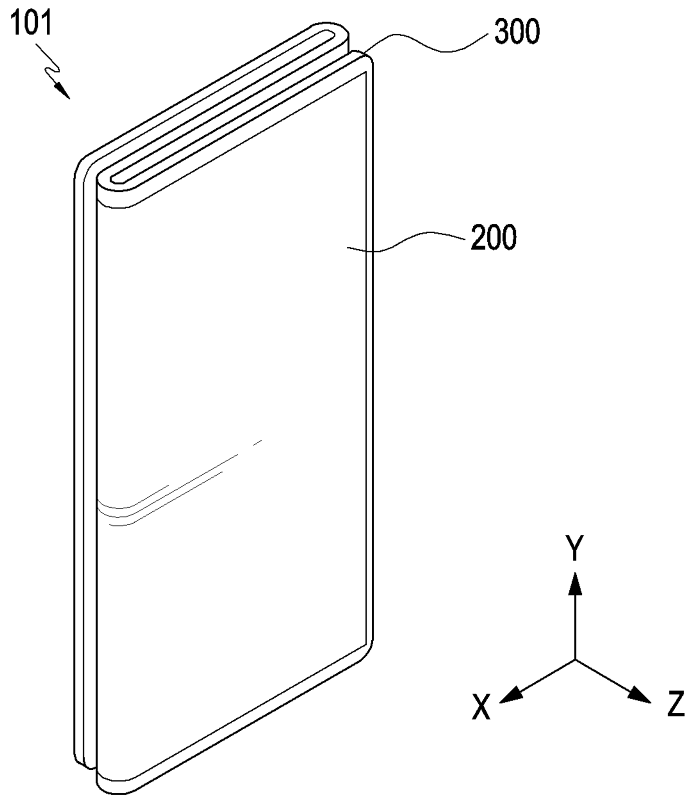
FIG. 2A is a perspective view illustrating a folded state of an electronic device according to an embodiment of the disclosure.
Figure 2B:
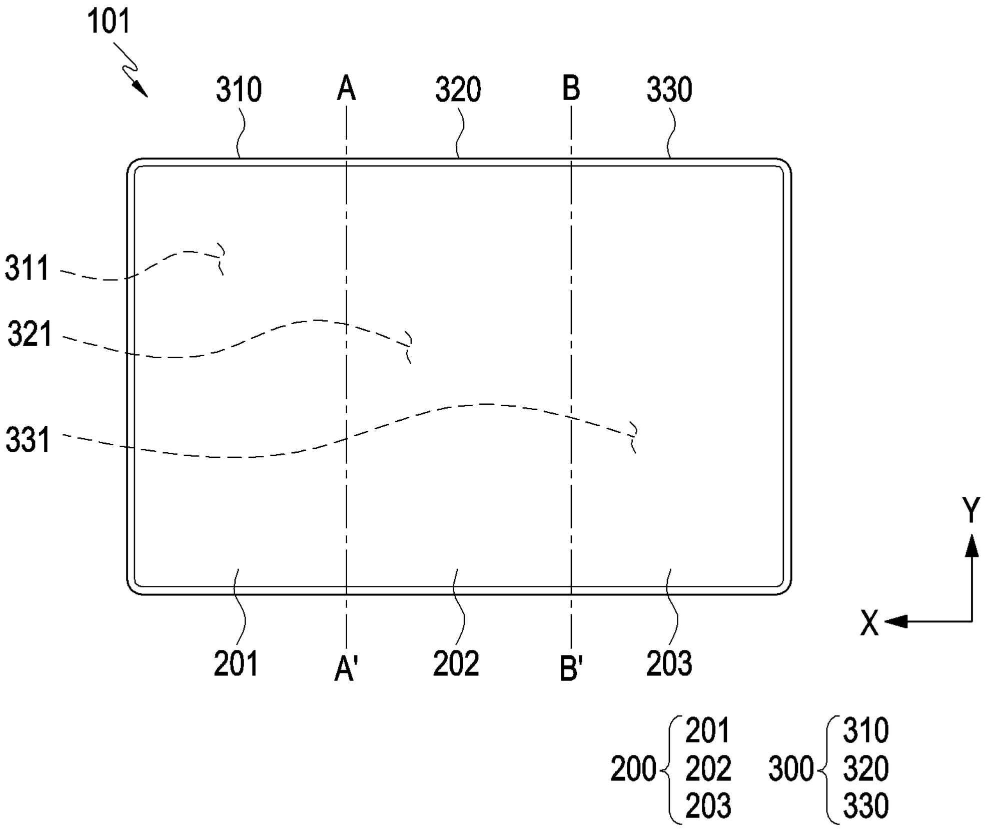
FIG. 2B is a front view illustrating an unfolded state of an electronic device according to an embodiment of the disclosure.
Figure 2C:
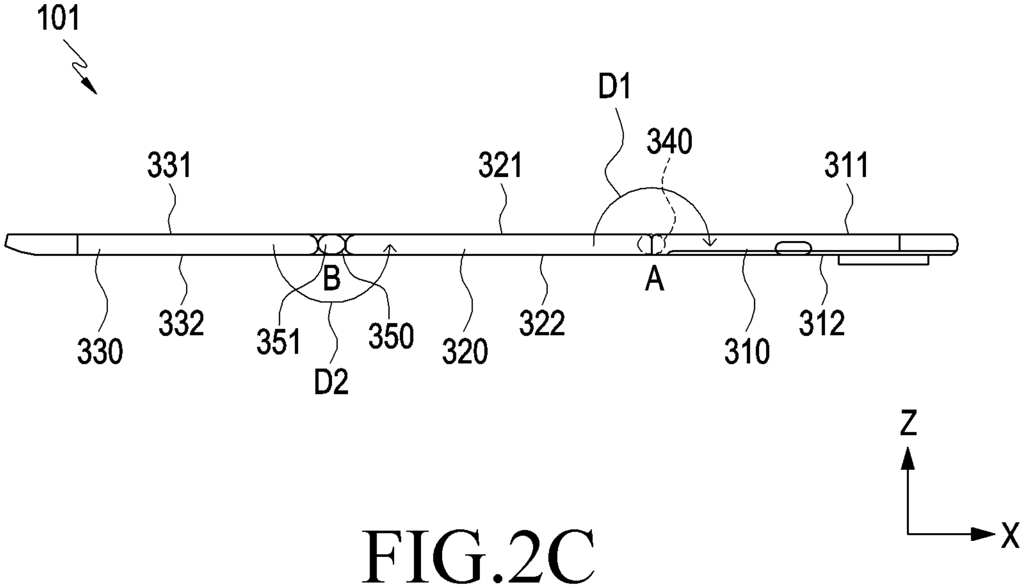
FIG. 2C is a side view illustrating an unfolded state of an electronic device according to an embodiment of the disclosure.
Figure 2D:
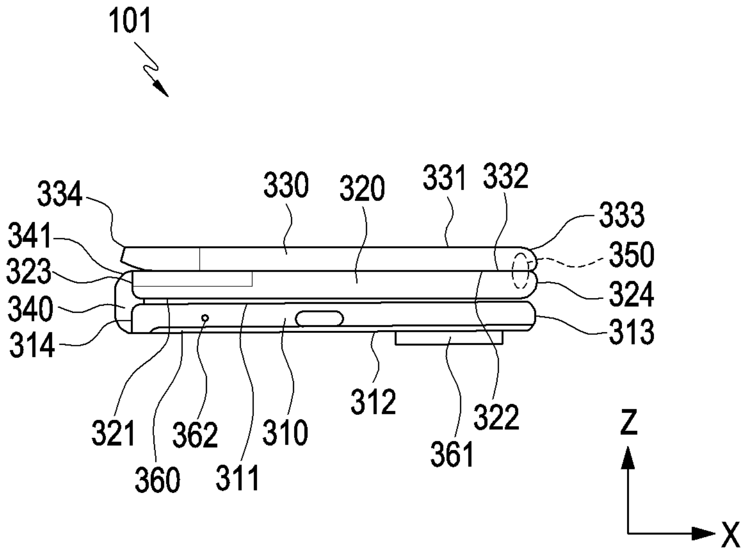
FIG. 2D is a side view illustrating an unfolded state of an electronic device according to an embodiment of the disclosure.

FIG. 2A is a perspective view illustrating a folded state of an electronic device according to an embodiment of the disclosure. FIG. 2B is a front view illustrating an unfolded state of an electronic device according to an embodiment of the disclosure. FIG. 2C is a side view illustrating an unfolded state of an electronic device according to an embodiment of the disclosure. FIG. 2D is a side view illustrating an unfolded state of an electronic device according to an embodiment of the disclosure.

Referring to FIGS. 2A to 2D, in an embodiment, the electronic device 101 may include a foldable housing 300 and a flexible or foldable display 200 (hereinafter, referred to as a "display" 200 for short) (e.g., the display device 160 of FIG. 1) disposed in a space formed by the foldable housing 300. According to an embodiment, a surface on which the display 200 is disposed (or a surface on which the display 200 is viewed from the outside of the electronic device 101) may be defined as the front surface of the electronic device 101. A surface opposite to the front surface may be defined as the rear surface of the electronic device 101. Further, surfaces surrounding a space between the front surface and the rear surface may be defined as the side surfaces of the electronic device 101.

According to various embodiments of the disclosure, the foldable housing 300 may include a first housing 310, a second housing 320, a third housing 330, a first hinge 340, and a second hinge 350.

According to various embodiments, the first housing 310 may be connected to the first hinge 340 and include a first surface 311 facing in a first direction and a second surface 312 facing in a second direction opposite to the first direction. The second housing 320 may be connected to the first hinge 340 and the second hinge 350, and include a third surface 321 facing in a third direction and a fourth surface 322 facing in a fourth direction opposite to the third direction. The third housing 330 may be connected to the second hinge 350 and include a fifth surface 331 facing in a fifth direction; and a sixth surface 332 facing in a sixth direction opposite to the fifth direction. The second housing 320 may rotate around the first hinge 340 (or a first pivot axis A-A') in a first rotation direction D1 to be folded to the first housing 310. The third housing 330 may rotate around the second hinge 350 (or a second pivot axis B-B') in a third rotation direction D2 to be folded to the second housing 320. Conversely, the second housing 320 may rotate around the first hinge 340 (or the first pivot axis A-A') in a second rotation direction to be unfolded from the first housing 310. The second rotation direction refers to a direction opposite to the first rotation direction D1. For example, when the first rotation direction D1 is a clockwise direction, the second rotation direction may correspond to a counterclockwise direction. In addition, the third housing 330 may rotate around the second hinge 350 (or the second pivot axis B-B') in a fourth rotation direction to be unfolded from the second housing 320. The fourth rotation direction refers to a direction opposite to the third rotation direction D2. For example, when the third rotation direction D2 is the counterclockwise direction, the fourth rotation direction may correspond to the clockwise direction. That is, the first rotation direction may be directed in the same direction as the fourth rotation direction, and the second rotation direction may be directed in the same direction as the third rotation direction. The electronic device 101 may change from a folded state to an unfolded state or from the unfolded state to the folded state.

The display 200 may be disposed on a space formed by the foldable housing 300. For example, according to an embodiment, part of the display 200 may be seated on a recess formed by the foldable housing 300 and form most of the front surface of the electronic device 101. The front surface of the electronic device 101 may include the display 200, and a partial area of the first housing 310, a partial area of the second housing 320, and a partial area of the third housing 330 adjacent to the display 200. For example, the display 200 may be disposed on at least one surface (e.g., the first surface 311, the third surface 321, or the fifth surface 331) of the foldable housing 300.

According to various embodiments, the display 200 may be a display in which at least a partial area is deformable into a flat or curved surface. According to an embodiment, the display 200 may include a first display 201 disposed on one side of the first pivot axis A-A', a second display 202 disposed between the first pivot axis A-A' and the second pivot axis B-B', and a third display 203 located on a side of the second pivot axis B-B' opposite to the second display 202. According to an embodiment, the first display 201 may be located on the first surface 311 of the first housing 310, and the second display 202 may be located on the third surface 321 of the second housing 320. The third display 203 may be located on the fifth surface 331 of the third housing 330. Accordingly, the first display 201 may face in the first direction, the second display 202 may face in the third direction, and the third display 203 may face in the fifth direction.

According to an embodiment, the second display 202 may integrally extend from the first display 201 located on the first surface 311 of the first housing 310 and be disposed on the third surface 321. The third display 203 may integrally extend from the second display 202 and be disposed on the fifth surface 331. For example, the display 200 included in the electronic device 101 may be substantially a single display 200. According to various embodiments, the display 200 may be divided into a plurality of display areas (e.g., a first area, a second area, and a third area) according to the first surface 311 of the first housing 310, and the third surface 321 and the fourth surface 322 of the second housing 320, on which the display 200 is disposed. For example, the first area may correspond to reference numeral 201 of FIG. 2B, the second area may correspond to reference numeral 202 of FIG. 2B, and the third area may correspond to reference numeral 203 of FIG. 2C. However, the division of areas of the display 200 is exemplary, and the display 200 may be divided into more or fewer plural (e.g., 4 or more or 2) areas depending on its structure or function.

According to various embodiments, the first housing 310 and the second housing 320 may be disposed on both sides of the first hinge 340 (or the first pivot axis A-A') and symmetrical in shape with respect to the first pivot axis A-A' as a whole. As described later, the angle and distance between the first housing 310 and the second housing 320 may vary depending on whether the electronic device 101 is in the unfolded state, the folded state, or a partially unfolded intermediate state. The shapes of the first housing 310 and the second housing 320 may not be necessarily limited thereto. According to an embodiment, the first housing 310 may further include a sensor area (not shown) in which various sensors are disposed, compared to the second housing 320. The second housing 320 and the third housing 330 may be disposed on both sides of the second hinge 350 (or the second pivot axis B-B') and symmetrical in shape with respect to the second pivot axis B-B' as a whole. As described later, the angle and distance between the second housing 320 and the third housing 330 may vary depending on whether the electronic device 101 is in the unfolded state, the folded state, or the partially unfolded intermediate state. The shape of the third housing 330 is not necessarily limited thereto either. According to an embodiment, the third housing 330 may additionally include a sensor area (not shown) in which various sensors are disposed.

Referring to FIGS. 2C and 2D, the first hinge 340 may further include a first hinge cover 341. The first hinge cover 341 may be disposed between the first housing 310 and the second housing 320 to cover an internal component (e.g., the first hinge 340). According to an embodiment, the first hinge cover 341 may be covered by parts of the first housing 310 and the second housing 320 or exposed to the outside according to the state (unfolded state, intermediate state, or folded state) of the electronic device 101. The second hinge 350 may further include a second hinge cover 351. The second hinge cover 351 may be disposed between the second housing 320 and the third housing 330 to cover an internal component (e.g., the second hinge 350). According to an embodiment, the second hinge cover 351 may be covered by parts of the second housing 320 and the third housing 330 or exposed to the outside according to the state (unfolded state, intermediate state, or folded state) of the electronic device 101.

According to an embodiment, when the electronic device 101 is unfolded, the second hinge cover 351 may be exposed to the outside, whereas the first hinge cover (e.g., the first hinge cover 341 of FIG. 2D) may be covered by the first housing 310 and the second housing 320 without being exposed to the outside, as illustrated in FIG. 2C. According to another embodiment, when the electronic device 101 is folded, the first hinge cover 341 may be exposed to the outside, whereas the second hinge cover 351 may be covered by the second housing 320 and the third housing 330 without being exposed to the outside, as illustrated in FIG. 2D. In another example, when the first housing 310 and the second housing 320 are in the intermediate state in which they are folded with a certain angle, the first hinge cover 341 may be partially exposed to the outside from between the first housing 310 and the second housing 320. In this case, however, the exposed area may be smaller than in the fully folded state. When the second housing 320 and the third housing 330 are in the intermediate state in which they are folded with a certain angle, the second hinge cover 351 may be partially exposed to the outside from between the second housing 320 and the third housing 330. However, in this case, the exposed area may be smaller than in the fully folded state. In an embodiment, the first hinge cover 341 and the second hinge cover 351 may include curved surfaces.

Referring back to FIGS. 2C and 2D, the first housing 310 may include a first side surface 313 parallel to the first pivot axis A-A' and a second side surface 314 located in a direction opposite to the first side surface 313 and connected to the first hinge 340. The second housing 320 may include a third side surface 323 connected to the first hinge 340 and located in a direction parallel to the second pivot axis B-B' and a fourth side surface 324 located in an opposite direction of the third side surface 323 and connected to the second hinge 350. The third housing 330 may include a fifth side surface 333 connected to the second hinge 350 and parallel to the first pivot axis A-A' and a sixth side surface 334 located in an opposite direction of the fifth side surface 333 and parallel to the second pivot axis B-B'.

When the first housing 310 rotates around the first hinge 340 with respect to the second housing 320, the first surface 311 of the first housing 310 may be folded in to face the third surface 321 of the second housing 320. When the second housing 320 rotates around the second hinge 350 with respect to the third housing 330, the third surface 321 of the second housing 320 may be folded out to face in the opposite direction of the fifth surface 331. In other words, the first hinge 340 may correspond to an in-fold type hinge, and the second hinge 350 may correspond to an out-fold type hinge.

Figure 3:
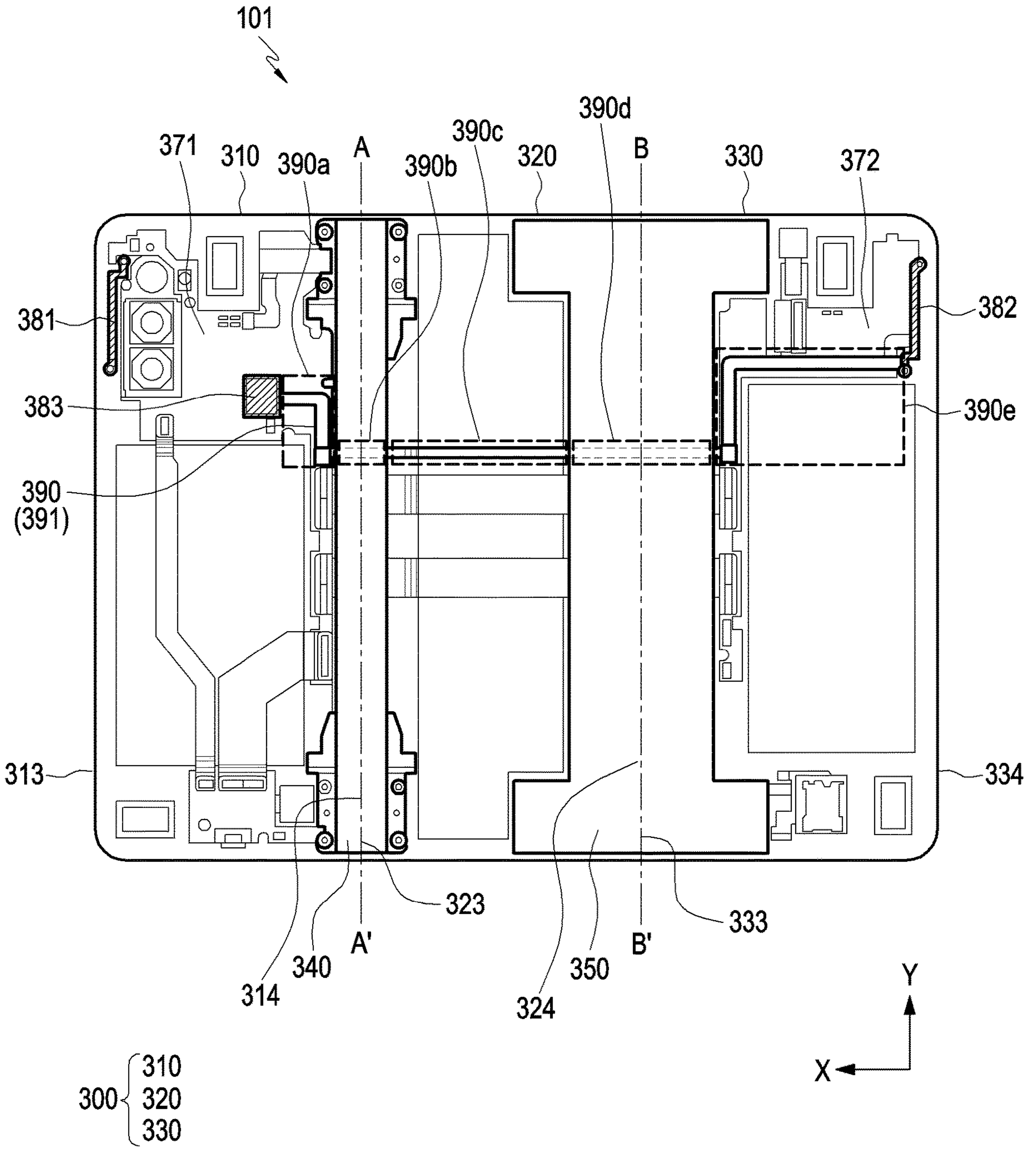
FIG. 3 is a diagram illustrating a schematic internal configuration of an electronic device in an unfolded state of the electronic device according to an embodiment of the disclosure.

FIG. 3 is a diagram illustrating a schematic internal configuration of an electronic device in an unfolded state of the electronic device according to an embodiment of the disclosure.

According to various embodiments, the first housing 310, the second housing 320, and the third housing 330 may form a space in which various components (e.g., a printed circuit board, a battery, or a wireless charging module) of the electronic device 101 may be arranged. According to an embodiment, one or more components may be disposed or visually exposed in the electronic device 101.

For example, referring back to FIG. 2D, at least part of a sub-display 360 or one or more components or sensors may be visually exposed through the first housing 310. In various embodiments, the sensors may include a proximity sensor 362 and/or a camera 361.

For example, referring to FIG. 3, the electronic device 101 may include a first circuit board 371 located inside the first housing 310 and including a communication circuit 383. The communication circuit may include an IFIC and/or an RFIC. The first circuit board 371 may correspond to, for example, a main circuit board. According to various embodiments of the disclosure, at least one antenna may be provided. According to an embodiment, a first antenna 381 may be provided on one side of the first circuit board 371 and electrically connected to the communication circuit 383. Referring to FIG. 3, the electronic device 101 may further include a second circuit board 372 located inside the third housing 330 and having a second antenna 382 on one side thereof. Embodiments of the first circuit board 371 and the second circuit board 372 illustrated in FIGS. 3 to 6 and 9 may vary. That is, it is to be noted that the drawings should not be construed as limiting.

An antenna (e.g., the first antenna 381 and the second antenna 382) according to various embodiments of the disclosure may include an antenna radiator according to various embodiments. In various embodiments, the antenna may include a patch-type antenna, a dipole-type antenna, or the like. In another example, the antenna may be formed by patterning at least part of a housing, or may be modularized and disposed on one side of the housing.

In the case of an electronic device, a connection member 390 may be connected from the communication circuit 383 to the antenna. The circuit board and the antenna may be electrically connected by the connection member 390. According to an embodiment, the first circuit board 371 and the second antenna 382 may be electrically connected to each other by the connection member 390.

The connection member 390 may include a PCB, a flexible printed circuit board (FPCB), a flat ribbon cable (FRC), and/or a coaxial cable. For example, the connection member 390 may be formed of an FPCB, thereby preventing repeated folding or unfolding operations of the first, second, and third housings 310, 320, and 330 from damaging a wiring structure. The connection member 390 may include a first connection member disposed at a position corresponding to the first hinge 340 and a second connection member disposed at a position corresponding to the second hinge 350. The connection member 390 may further include a third connection member disposed between the first hinge 340 and the second hinge 350. According to an embodiment, the first connection member may have a first physical property in the first hinge 340, and the second connection member may have a second physical property in the second hinge 350. Although the physical properties may mean mechanical properties of a material such as a bending strength or a tensile strength, they may also mean electrical properties related to a loss rate in transmitting an input/output signal. For example, a PCB, an FPCB, an FRC, and/or a coaxial cable may be understood as having different physical properties.

According to another embodiment, the connection member 390 may include a plurality of connection members 390 classified according to the positions of the connection member 390 disposed in the first, second, and third housings 310, 320, and 330, the first hinge 340, and the second hinge 350. For example, the connection member 390 may include a connection member disposed in an area 390*a* corresponding to the first housing 310, a connection member disposed in an area 390*b* corresponding to the first hinge 340, a connection member disposed in an area 390*c* corresponding to the second housing 320, a connection member disposed in an area 390*d* corresponding to the second hinge 350, and a connection member disposed in an area 390*e* corresponding to the third housing 330. The connection member 390 may be configured through a combination of connection members having different physical properties, disposed in the areas corresponding to the first, second, and third housings 310, 320, and 330, the first hinge 340, and the second hinge 350. The communication circuit 383 may be electrically connected to the first antenna 381 or the first circuit board 371 on which the first antenna 381 is disposed to receive an input/output signal (e.g., an RF or IF (interface) signal). According to various embodiments, as the communication circuit 383 is disposed in the first housing 310, and the second antenna 382 is disposed adjacent to the sixth side surface 334 of the third housing 330, the length of the connection member 390 between the communication circuit 383 and the second antenna 382 may be greater than that of the connection member between the communication circuit 383 and the first antenna 381. In order to increase the integrity of the electronic device, an input/output signal (e.g., an RF or IF signal) passing through the connection member 390 may need to have a minimum loss value. For example, when it is said that the second antenna 382 is disposed adjacent to the sixth side surface 334 of the third housing 330, this may imply that the distance between the second antenna 382 and the sixth side surface 334 of the third housing 330 is smaller than the distance between the second antenna 382 and the fifth side surfaces 333 of the third housing 330. For example, the distance between the second antenna 382 and the sixth side surface 334 of the third housing 330 may be within 1 cm.

For example, referring to FIG. 3, to electrically connect an input/output signal of the communication circuit 383 to the second antenna 382 or the second circuit board 372 on which the second antenna 382 is disposed, the connection member 390 may be configured by combining an FPCB or an FRC.

For example, the connection member 390 disposed in the electronic device 101 may be disposed to pass through the first hinge 340 and the second hinge 350, and it may be important to design the connection member 390 such that the first hinge 340 and the second hinge 350 rotate smoothly.

Regarding the loss value of the input/output signal, for example, when the connection member 390 is formed of a 150-mm FRC and a 100-mm PCB, a loss of 12.1 dB (=150*0.3+100*0.76) occurs, thereby degrading, for example, the output of a 5G antenna module.

Referring to [Table 1] below, a PCB, an FPCB, an FRC, and/or a coaxial cable may be used as the connection member 390 that transmits an input/output signal. Each product may have a different loss value in transmitting an input/output signal. For example, when a loss coefficient value per mm as the length of a PCB wiring is defined as 1, the loss coefficient value is about 0.62 for the PCB, 0.4 for the FRC, and 0.21 for the coaxial cable. Referring to these loss coefficient values, it may be advantageous in minimizing the loss value of an input/output signal to form a connection member using a coaxial cable and an FRC when possible.

TABLE 1

| Material | Loss (per mm) |
|---|---|
| PCB | 0.76 |
| FPCB | 0.47 |
| FRC | 0.3 |
| Coaxial Cable | 0.16 |

Figure 4:
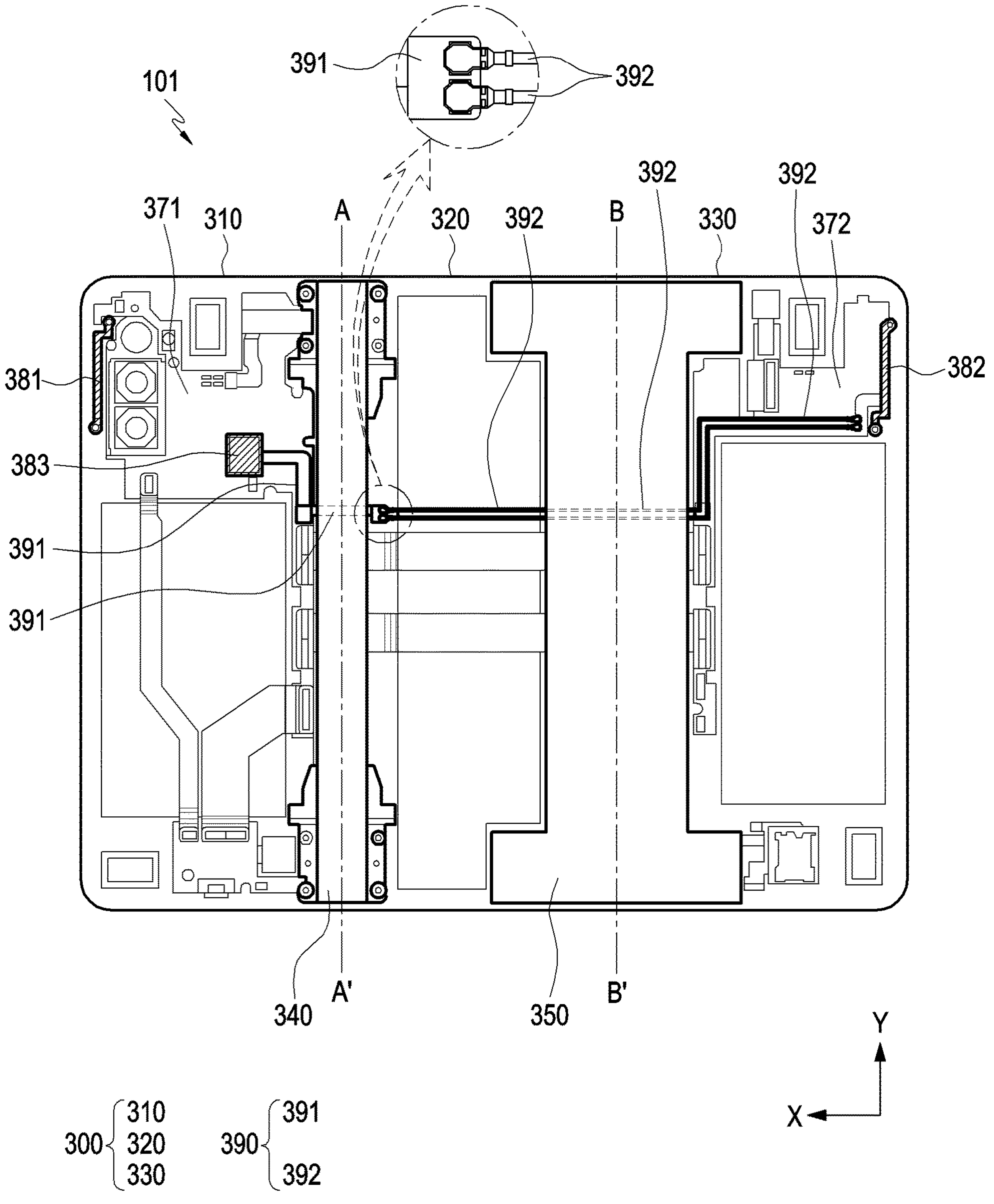
FIG. 4 is a diagram illustrating an unfolded state of an electronic device different from that of FIG. 3 according to an embodiment of the disclosure.
Figure 5:
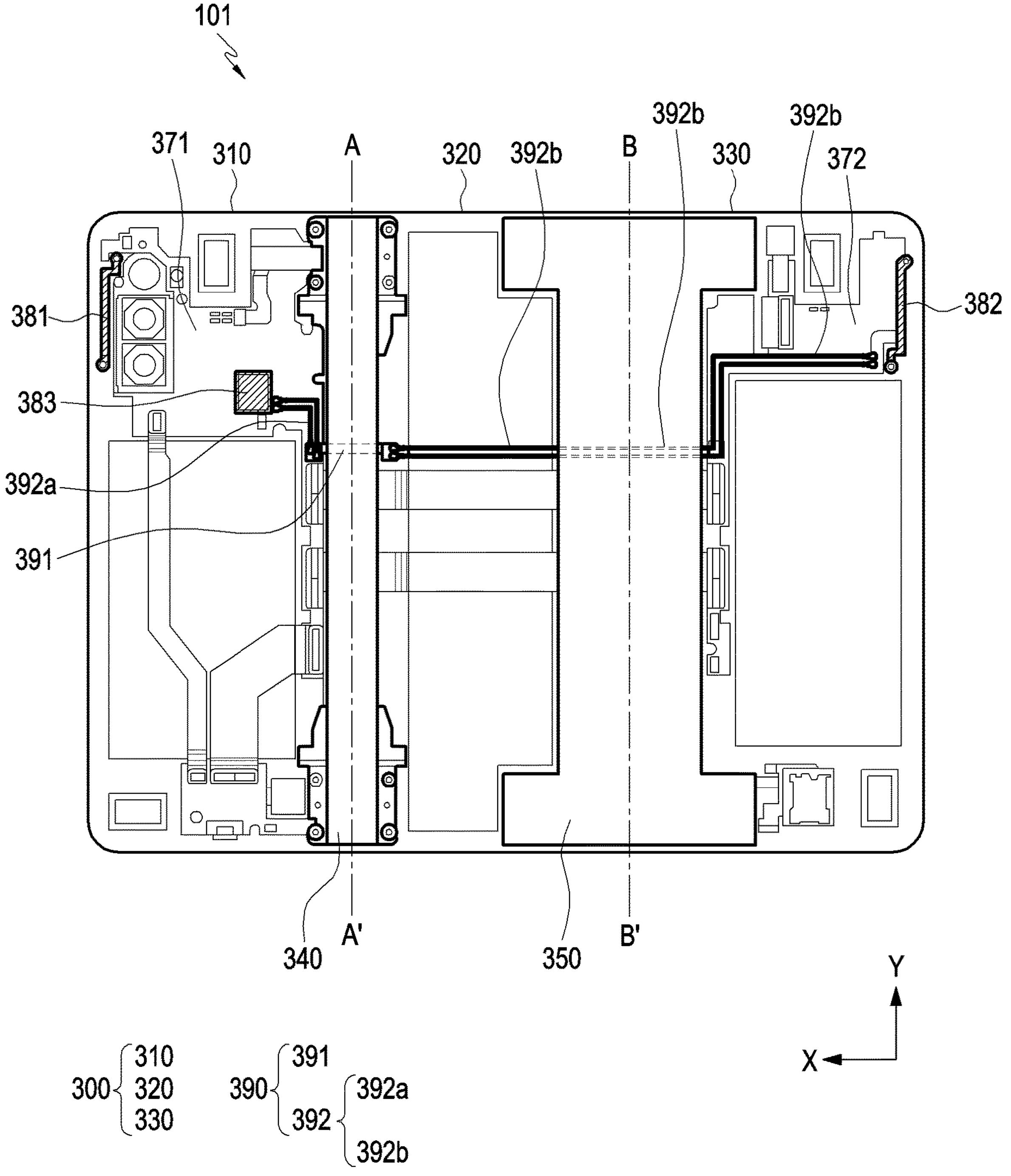
FIG. 5 is a diagram illustrating an unfolded state of an electronic device different from that of FIG. 3 according to an embodiment of the disclosure.
Figure 6:
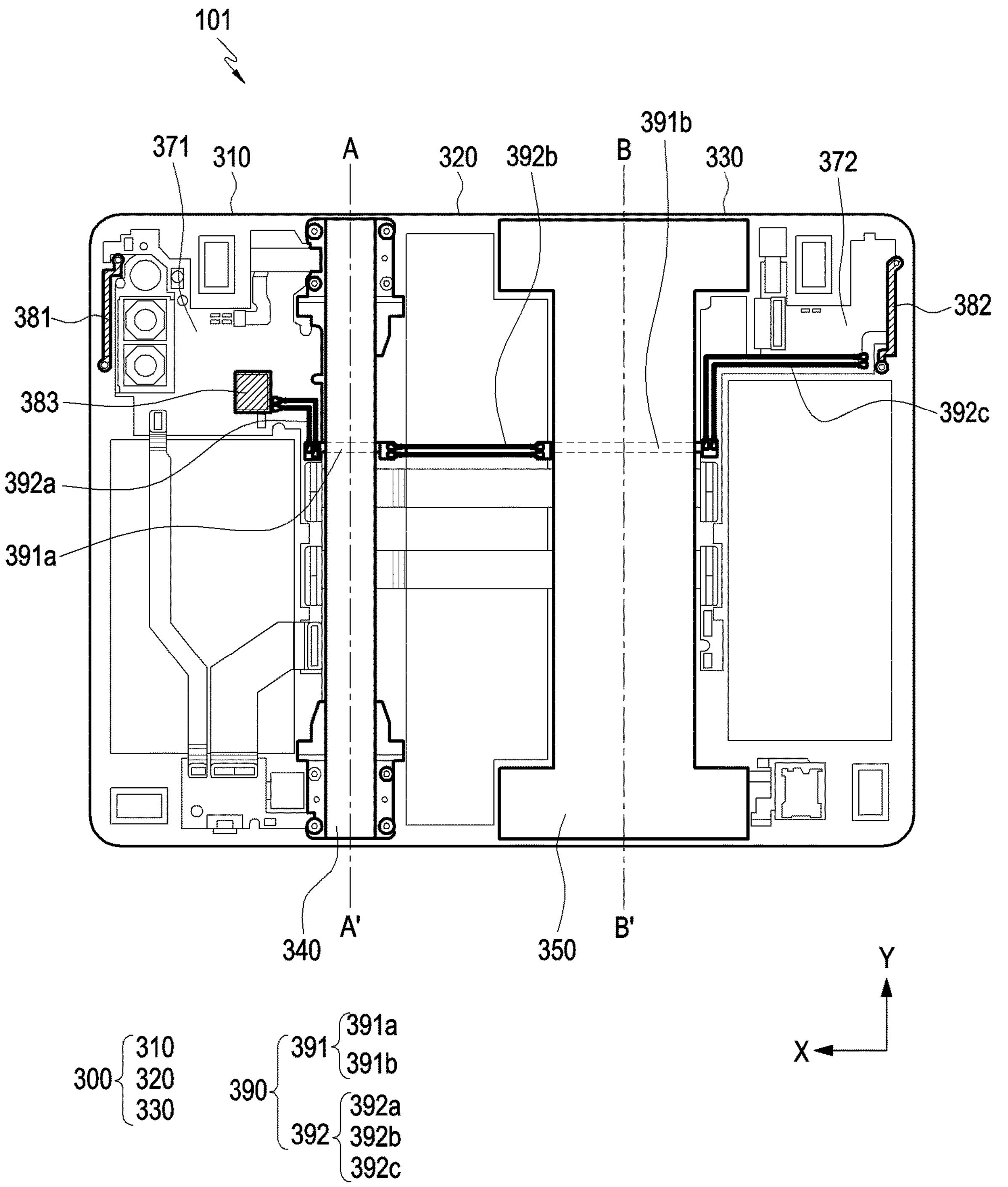
FIG. 6 is a diagram illustrating an unfolded state of an electronic device different from that of FIG. 3 according to an embodiment of the disclosure.

FIG. 4 is a diagram illustrating an unfolded state of an electronic device different from that of FIG. 3 according to an embodiment of the disclosure. FIG. 5 is a diagram illustrating an unfolded state of an electronic device different from that of FIG. 3 according to an embodiment of the disclosure. FIG. 6 is a diagram illustrating an unfolded state of an electronic device of FIG. 3 according to an embodiment of the disclosure. A redundant description to that of FIG. 3 will be avoided below. In the embodiment referring to FIG. 4, the connection member 390 may be configured to at least partially include a coaxial cable. For example, the connection members 390 located at the sides of the first housing 310 and the first hinge 340 are formed of an FRC, whereas the connection members 390 located at the sides of the second housing 320, the second hinge 350, and the third housing 330 may be configured to include a coaxial cable 392. For example, a smaller amount of signal loss may occur than in a comparative embodiment in which a connection member is formed of only one FPCB or FRC or a combination of an FPCB and an FRC. A connection member 391 formed of an FRC and a connection member 390 formed of the coaxial cable 392 may be integrally coupled with each other or connected through a connector. According to another embodiment, a coupling member (e.g., a connector, an adapter, a converter, a PCB, and/or an FPCB) may be included between the connection member 391 formed of an FRC and the coaxial cable.

According to an embodiment, the curvature of the connection member located at the first hinge 340 may be smaller than the curvature of the connection member located at the second hinge 350 in the closed state. Therefore, the connection member 391*a* located at the first hinge 340 may be configured as a connection member (e.g., FRC) having a first thickness, and the connection member 391*b* located at the second hinge 350 may be configured as a connection member (e.g., coaxial cable) having a thickness greater than the first thickness. However, the types of the connection members located at the first hinge 340 and the second hinge 350 are not limited to any particular embodiment. Various types of the connection members located at the first hinge 340 and the second hinge 350 will be described below in detail.

In the embodiment referring to FIG. 5, the connection member 390 is configured to at least partially include a coaxial cable. For example, while the connection member 390 located at the first hinge 340 is formed of an FRC, the connection members 390 located in the remaining first housing 310, second housing 320, second hinge 350, and third housing 330 may be configured to include the coaxial cable 392. More specifically, for example, a first coaxial cable 392*a* may be formed from the communication circuit 383 to one side surface of the first hinge 340, an FRC may be formed from one surface to the other surface of the first hinge 340, and a second coaxial cable 392*b* may be formed from the other surface of the first hinge 240 to a side surface of the third housing 330 and the second antenna 382 through the second hinge 350. Typically, it is possible to form the FRC thinner than the coaxial cable 392. Therefore, the FRC may be easily located in a narrow space of the first hinge 340, compared to the coaxial cable 392. In this case, a smaller amount of signal loss may occur than in the embodiment illustrated in FIG. 3.

In the embodiment referring to FIG. 6, for example, the connection members 390 located at the first hinge 340 and the second hinge 350 may be formed of an FRC, and the connection members 390 located in the remaining first housing 310, second housing 320, second hinge 350, and third housing 330 may be formed to include the coaxial cable 392. More specifically, for example, the first coaxial cable 392*a* may be formed from the communication circuit 383 to one surface of the first hinge 340, an FRC may be formed from the one surface to the other surface of the first hinge 340, and the second coaxial cable 392*b* may be formed from the other surface of the first hinge 340 to one surface of the second hinge 350. An FRC may be formed from the one surface to the other surface of the second hinge 350, and a third coaxial cable 392*c* may be formed from the other surface of the second hinge 350 to a side surface of the third housing 330 and the second antenna 382. In this case, a smaller amount of signal loss may also occur than in the embodiment illustrated in FIG. 3.

Figure 7:
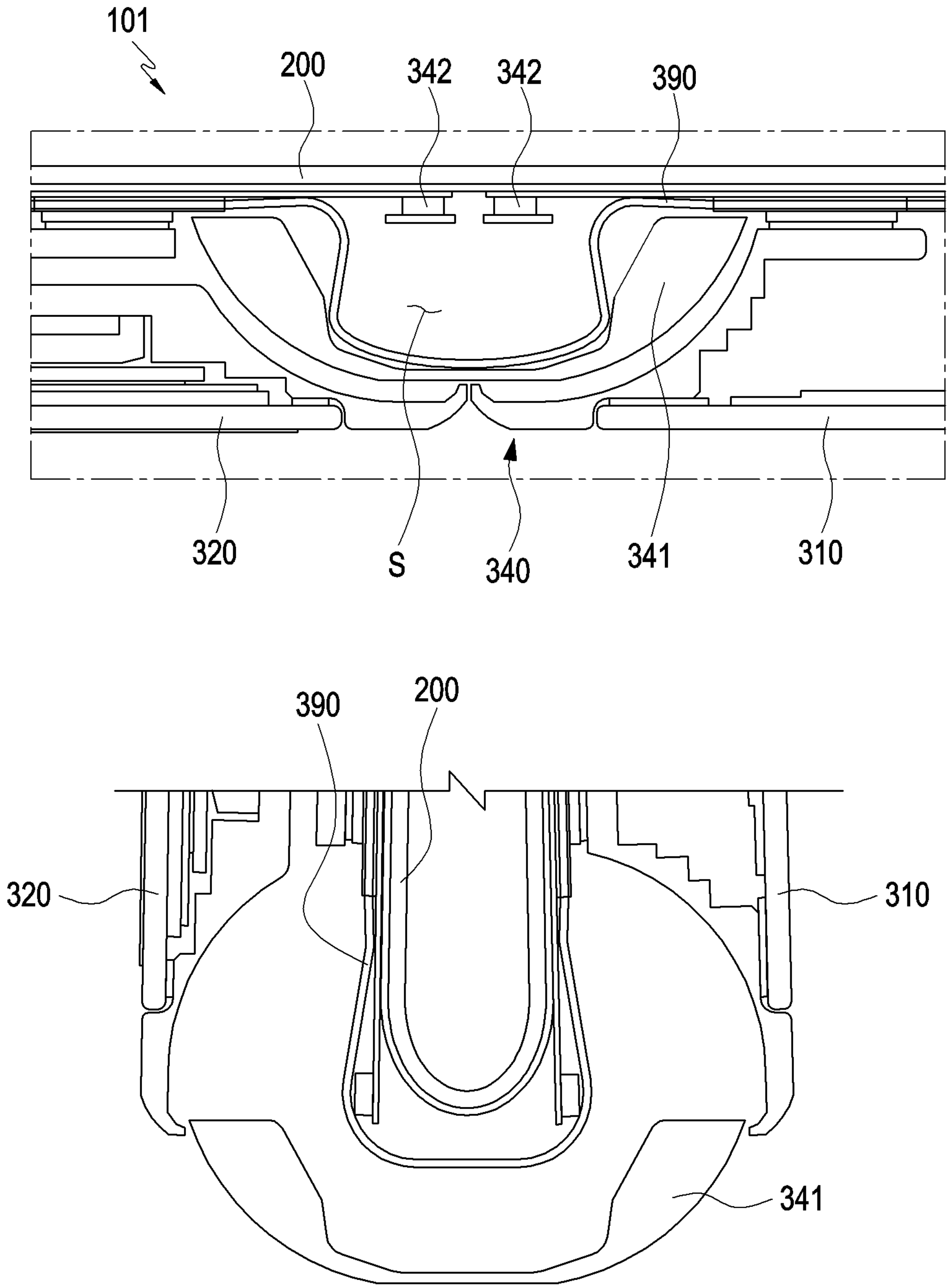
FIG. 7 is a diagram illustrating an internal structure of a first hinge during an unfolding operation of an electronic device according to an embodiment of the disclosure.

FIG. 7 is a diagram illustrating an internal structure of the first hinge 340 during an unfolding operation of the electronic device 101 according to an embodiment of the disclosure.

Referring to FIG. 7, in a folding area where the display 200 is folded, the connection member 390 may be disposed in a space inside the first hinge 340, thereby establishing an electrical connection relationship between an electronic component disposed inside the first housing 310 and an electronic component disposed inside the second housing 320. It may be identified from the first hinge 340 of FIG. 7 that hinge plates 342 are provided on the bottom of the display 200, and the connection member 390 is disposed under the hinge plates 342. The connection member 390 may be disposed in a predetermined curved state on an inner space S of the first hinge 340. According to an embodiment, the connection member 390 may have a predetermined extra length. Only when an extra length is given to the connection member 390, the connection member 390 may smoothly maintain the electrical connection relationship between an electronic component disposed in the first housing 310 and an electronic component disposed in the second housing 320 without interfering with a deformed structure during folding of the display 200 and the hinge plates 342 in the folded state of the electronic device.

Figure 8:
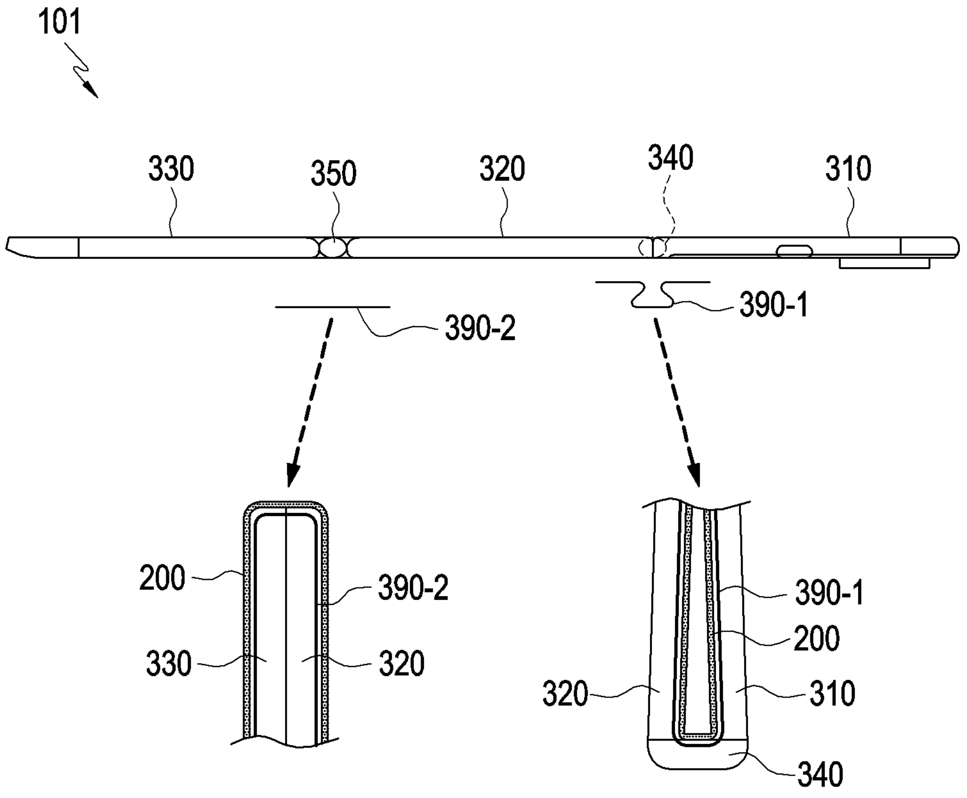
FIG. 8 is a diagram illustrating connection members in an in-fold type hinge and an out-fold type hinge according to an embodiment of the disclosure.

FIG. 8 is a diagram illustrating connection members in an in-fold type hinge and an out-fold type hinge according to an embodiment of the disclosure.

Referring to FIG. 8, according to various embodiments, the curvature of a connection member disposed on the first hinge 340 may be less than the curvature of a connection member disposed on the second hinge 350. According to a certain embodiment, the connection member disposed on the first hinge 340 and/or the second hinge 350 may have an extra length to prevent damage during folding or unfolding. For example, in the case of a connection member crossing the first hinge 340 and the second hinge 350 in the same lengths, the connection member of a small curvature disposed on the first hinge 340 may have a smaller extra length than the connection member disposed on the second hinge 350. Conversely, the connection member disposed on the second hinge 350 may have a greater extra length than the connection member disposed on the first hinge 340. Alternatively, since the curvature of the second hinge 350 is great relative to that of the first hinge 340, the connection member disposed on the second hinge 350 may be formed without an extra length, and the connection member disposed on the branch of the first hinge 340 may be formed with an extra length.

According to an example, at least a partial area of the connection member 390-1 disposed in the inner space of the first hinge 340 may be extended and unfolded along the rear surface of the display during in-folding. At least a partial area of the connection member 390-2 disposed in the inner space of the second hinge 350 may be extended and unfolded along the rear surface of the display during out-folding. The connection member disposed on the first hinge 340 and/or the second hinge 350 may have an extra length equal to that of a part that is not extended in the inner space of a hinge cover during folding. Referring to FIG. 8, it is not easy to secure an extra length for the first hinge 340 having a relatively small curvature, compared to the second hinge 350 having a relatively large curvature, and thus the design difficulty of the first hinge 340 may be high. In an embodiment to be described later, a method of optimizing the design of the first hinge 340 according to a mounting environment of an FRC or a coaxial cable may be disclosed.

Figure 9:
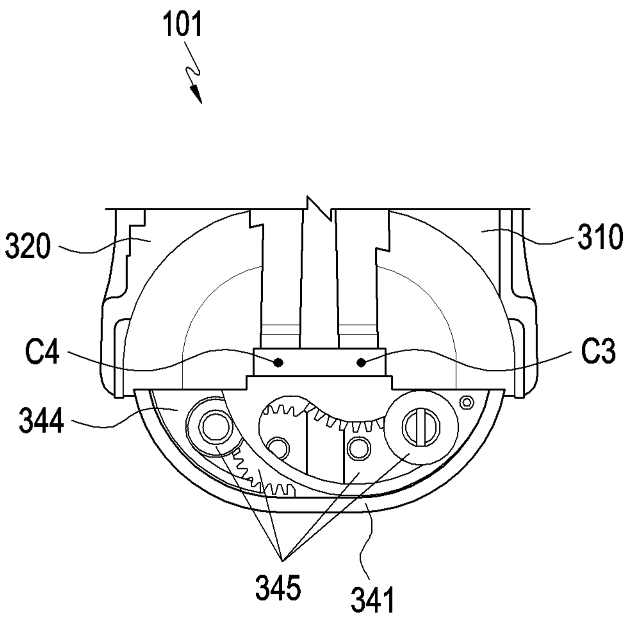
FIG. 9 is a diagram illustrating the interior of a first hinge according to an embodiment of the disclosure.
Figure 10:
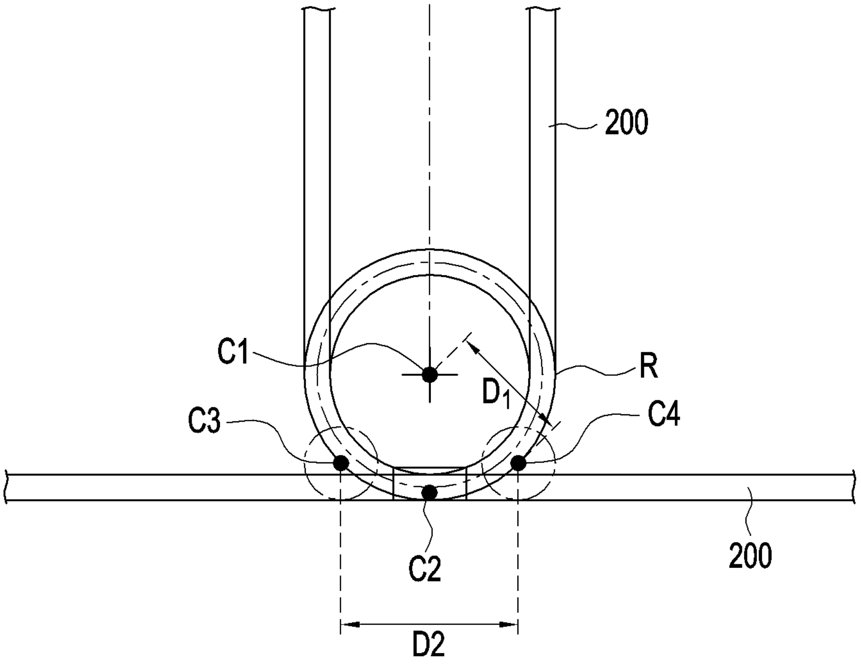
FIG. 10 is a diagram illustrating a rotation center of a display, a bottom center, and a center of a hinge axis of a first hinge during unfolding and folding operations of an electronic device according to an embodiment of the disclosure.

FIG. 9 is a diagram illustrating the interior of the first hinge 340 according to an embodiment of the disclosure. FIG. 10 is a diagram illustrating a rotation center of the display, a bottom center, and a center of a hinge axis of the first hinge 340 during unfolding and folding operations of the electronic device 101 according to an embodiment of the disclosure.

In various embodiments of the disclosure, the first hinge 340 may correspond to a dual hinge axis-type hinge unit having two imaginary axes C3 and C4 parallel to each other as rotation axes. Referring to FIG. 9, the dual hinge axis-type hinge unit may include, for example, a first bracket inner gear 343 and a second bracket inner gear 344 disposed inside the first hinge cover 341, and further include a plurality of gears 345 moving in mesh with these inner gears.

The following description may be given in the context of a dual hinge axis-type hinge unit.

Referring to FIGS. 9 and 10 together, the display 200 may be folded around a center point C1 of a radius of curvature R, and a bottom point C2 may be formed at a position lower than the centers C3 and C4 of the imaginary axes of the first hinge 340 during folding and unfolding of the electronic device 101. In another example, each of the centers C3 and C4 of the imaginary axes of the first hinge 340 may be formed inside a maximum radius of curvature R of the display 200.

In various embodiments of the disclosure, an embodiment of the first hinge 340 to which a connection member formed of a material (e.g., PCB, FPCB, or FRC) is applied has been disclosed. In various embodiments of the disclosure, an embodiment of a connection member formed of the coaxial cable 392 and the first hinge 340 using the same is disclosed. Since the coaxial cable 392 is generally thicker than a material such as a PCB, an FPCB, or an FRC, it may not be easy to introduce the coaxial cable 392 to the first hinge 340. In addition, considering a length change caused by the folding operation, there may be a need for configuring the coaxial cable 392 in a sufficient length in the inner space of the first hinge 340 and preventing the coaxial cable 392 from damaging other structures (e.g. the hinge plates or the hinge covers).

Figure 11:
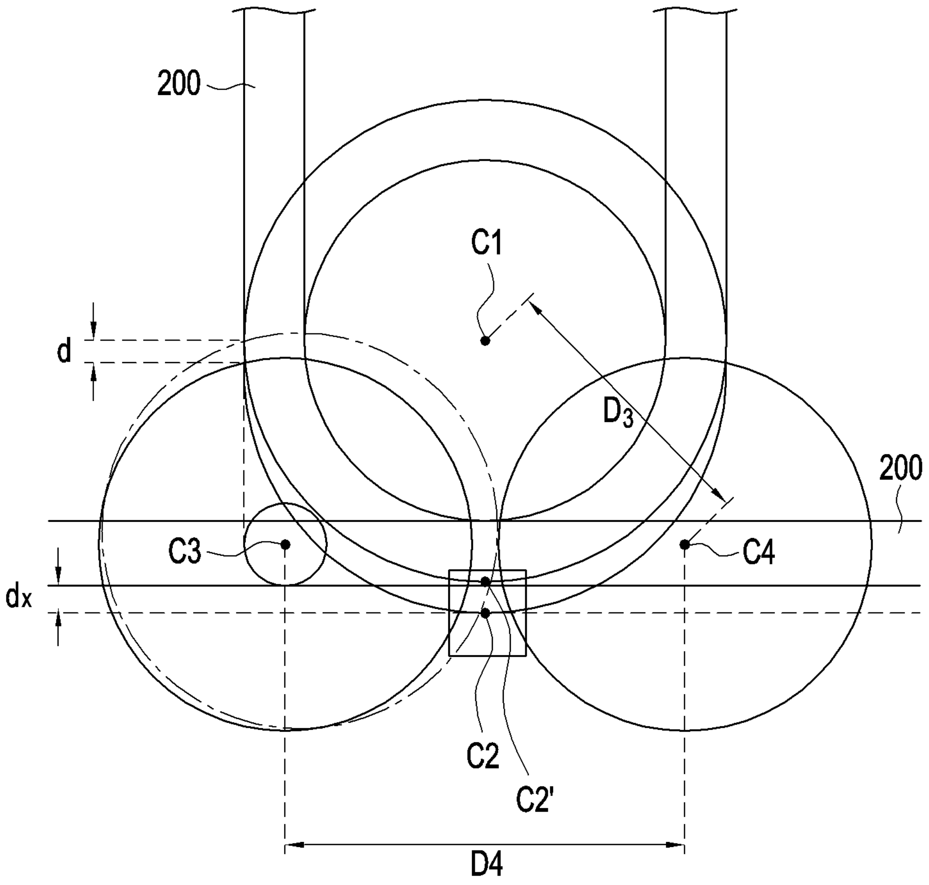
FIG. 11 is a diagram illustrating a rotation center of a display, a bottom center, and a center of a hinge axis of a first hinge during unfolding and folding operations of an electronic device different from that of FIG. 10 according to an embodiment of the disclosure.

FIG. 11 is a diagram illustrating a rotation center of the display, a bottom center, and a center of a hinge axis of the first hinge 340 during unfolding and folding operations of the electronic device 101 different from that of FIG. 10 according to an embodiment of the disclosure.

Referring to FIG. 11, an in-foldable display having the same radius of curvature as in FIG. 10 is illustrated. FIG. 11 differs from FIG. 10 in that the different axis centers C3 and C4 of the first hinge 340 are axially moved in a direction away from the point C1 in FIG. 10, compared to FIG. 8. For example, when the distance between C1 and C3 (or C4) in FIG. 10 is D1, the distance between C1 and C3 (or C4) in FIG. 11 may be D3 greater than D1. In another example, when the distance between C3 and C4 in FIG. 10 is D2, the distance between C3 and C4 in FIG. 11 may be D4 greater than D2. This may mean a hinge axis movement for increasing the space of the first hinge 340 to apply a coaxial cable to the first hinge 340. According to another example, this may mean not only the hinge axis movement for increasing the space of the first hinge 340 but also a hinge axis movement for increasing a space for a fixing member 393 described below. As a result of the hinge axis movement, a gap of d in a height direction may be secured, compared to the prior art. The bottom point C2 may move in a −y direction to a point C2' by a distance (dx).

In the embodiment illustrated in FIG. 11, the different axis centers C3 and C4 of the first hinge 340 may be located at points outside the radius of curvature of the display.

In summary of the above description, various embodiments of the disclosure may also provide an effective method of applying a coaxial cable by moving the different axis centers C3 and C4 of the first hinge 340.

Figure 12:
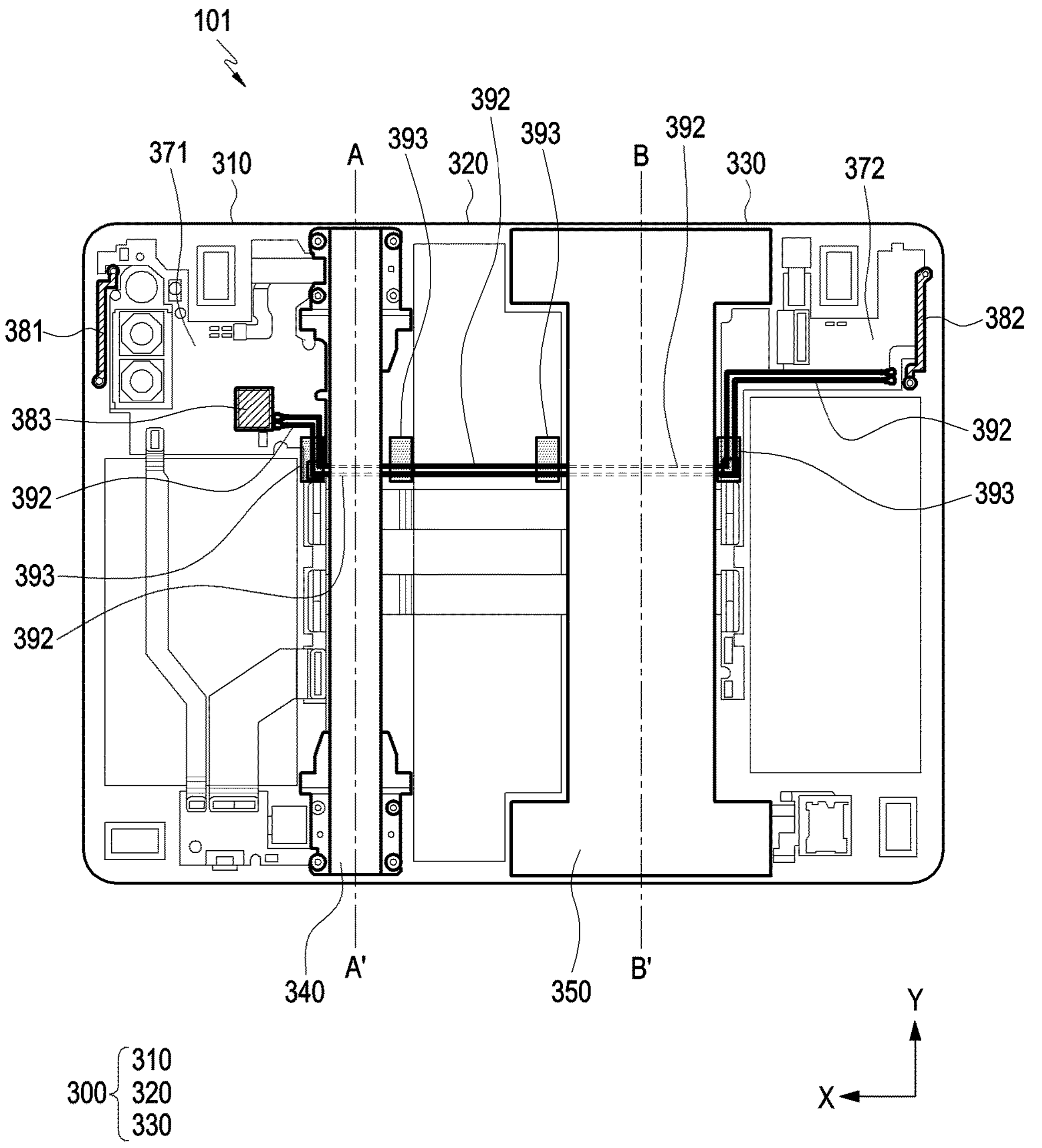
FIG. 12 is a diagram illustrating a schematic internal configuration of an electronic device in an unfolded state of the electronic device according to an embodiment of the disclosure.

FIG. 12 is a diagram illustrating a schematic configuration of an electronic device in an unfolded state of the electronic device according to an embodiment of the disclosure.

In various embodiments of the disclosure, a PCB, an FPCB, an FRC, and a coaxial cable are disclosed as examples of the connection member 390. In an embodiment, the connection member 390 may be formed of a coaxial cable having a minimum loss value. For example, the coaxial cable may have a loss coefficient value of about 0.16. In consideration of this loss coefficient value, it may be best to form the entire connection member 390 of a coaxial cable.

In the embodiment referring to FIG. 12, the entire connection member 390 located in the first housing 310, the second housing 320, and the third housing 330, including the first hinge 340 and the second hinge 350 is shown as configured to include the coaxial cable 392. According to an embodiment, a smaller amount of signal loss may occur than when the connection member 390 is at least partially formed of an FPCB or an FRC. In an embodiment, when the coaxial cable 392 is applied to the first hinge 340, the configuration of the first hinge 340 to which the hinge axis movement mechanism of FIG. 11 is applied may be implemented.

According to various embodiments, the coaxial cable 392 may be configured in a sufficient length in the inner space of the first hinge 340 in consideration of a length change caused by the folding operation, and a fixing member 393 may further be included to prevent damage to the coaxial cable 392 or other structures (e.g., the hinge plates) during the folding and unfolding operations of the electronic device 101.

Figure 13:
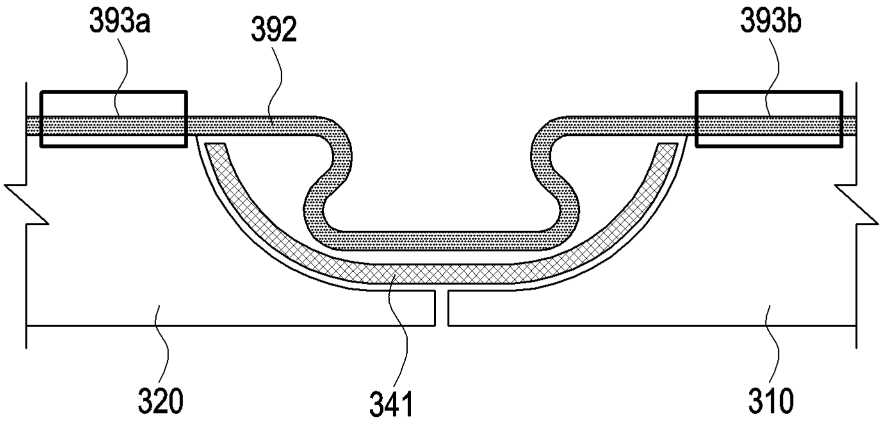
FIG. 13 is a diagram illustrating a fixing member according to an embodiment of the disclosure.
Figure 14:
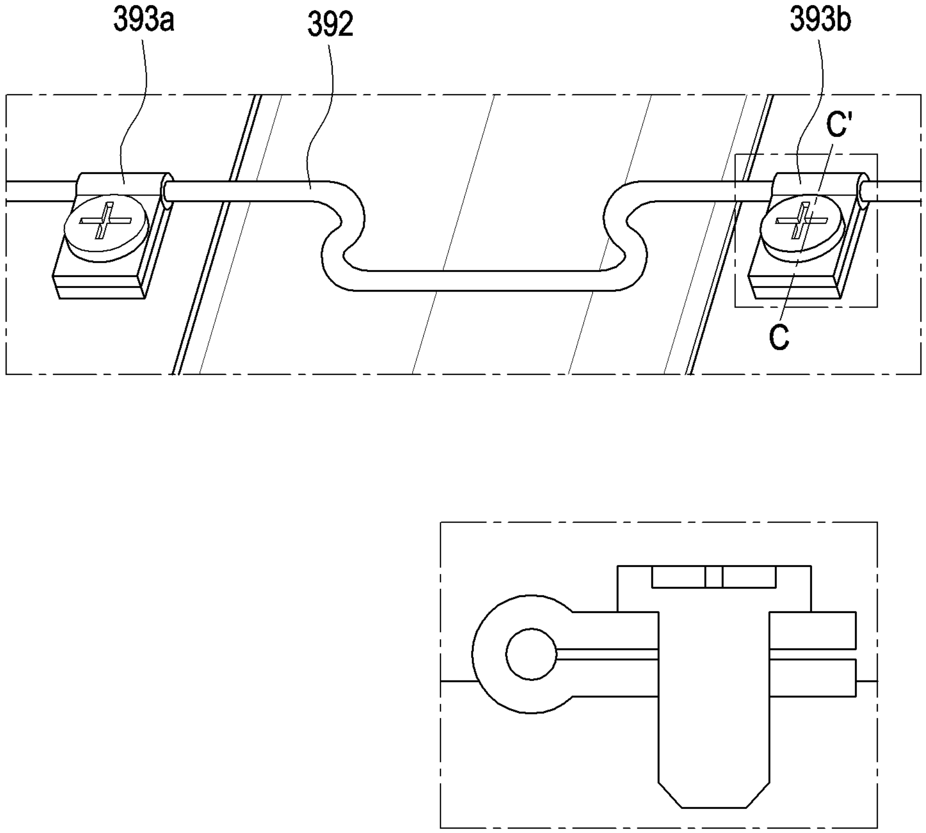
FIG. 14 is a diagram illustrating a fixing member according to an embodiment of the disclosure.
Figure 15:
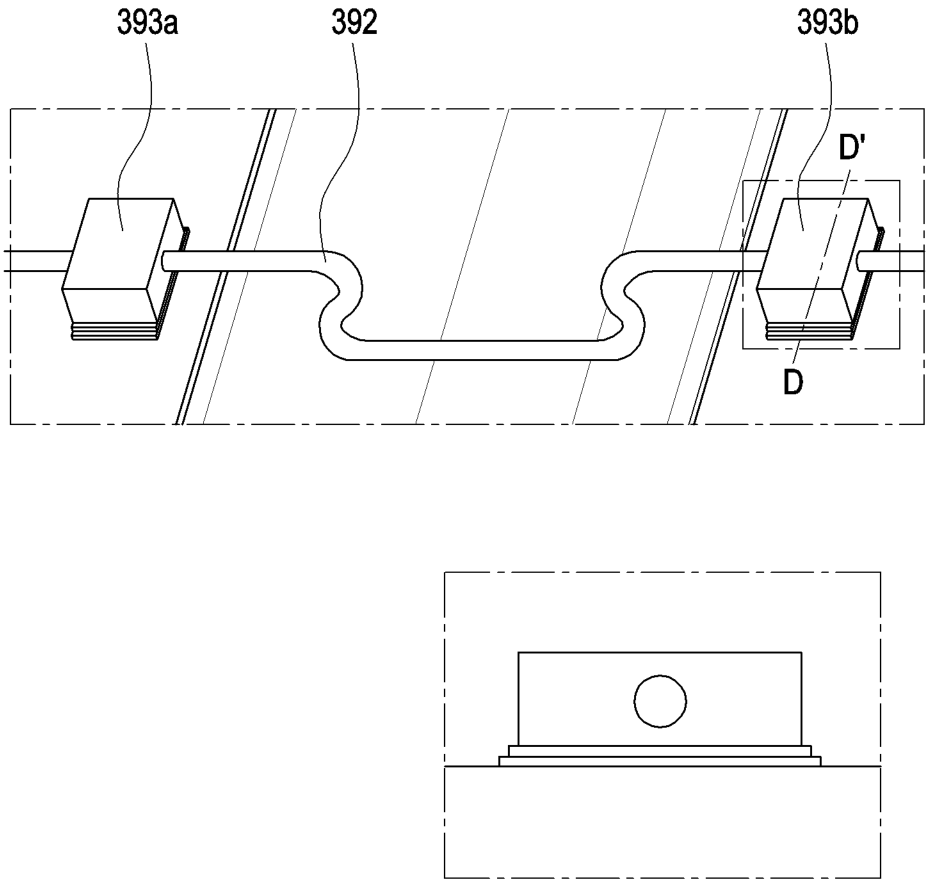
FIG. 15 is a diagram illustrating a fixing member according to an embodiment of the disclosure.

FIG. 13 is a diagram illustrating the fixing member 393 according to an embodiment of the disclosure. FIG. 14 is a diagram illustrating the fixing member 393 according to an embodiment of the disclosure. FIG. 15 is a diagram illustrating the fixing member 393 according to an embodiment of the disclosure.

The fixing member 393 may be provided on each of one surface (or one end) and the other surface (or the other end) of the first hinge 340 and/or the second hinge 350, and prevent excessive movement of the coaxial cable 392 in the process of folding and/or unfolding the electronic device 101.

According to various embodiments of the disclosure, various types of fixing members may be available as the fixing member 393. The fixing member is an embodiment of a method of fixing starting and ending portions of a folding part of a coaxial cable, and may prevent movement of the coaxial cable in three axes (X, Y, Z axes).

For example, screw clip-type fixing members 393*a* and 393*b* may be applied according to the first embodiment of FIG. 14, and rigid dummy-type fixing members 393*a* and 393*b* may be applied according to the second embodiment of FIG. 15. Besides, an embodiment of the fixing member according to various embodiments may be applied.

According to various embodiments of the disclosure, a fixing member may be provided in each of the first housing and the second housing located on both sides of the first hinge 340.

According to various embodiments of the disclosure, a fixing member may be provided in each of the second housing and the third housing located on both sides of the second hinge 350. At least one of the fixing members 393*a* and 393*b* may be configured to be movable, and the distance between the two fixing members may be changed. For example, in an open state, at least one connection member may move in a direction away from a hinge axis.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term 'non-transitory' simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

The invention claimed is:

1. An electronic device comprising:

a flexible display;

a first housing including a first surface facing in a first direction and a second surface facing in a second direction opposite to the first direction, wherein at least one portion of the flexible display is disposed on the first surface;

a first hinge, connected to a side surface of the first housing, adapted to fold in a first rotation direction and unfold in a second rotation direction;

a second housing, connected to the first hinge, including a third surface facing in a third direction and a fourth surface facing in a fourth direction, wherein at least one portion of the flexible display is disposed on the third surface;

a second hinge, connected to a side surface of the second housing, adapted to fold in a third rotation direction and unfold in a fourth rotation direction;

a third housing, connected to the second hinge opposite from the second housing with respect to the second hinge, including a fifth surface facing in a fifth direction and a sixth surface facing in a sixth direction, wherein at least one portion of the flexible display is disposed on the fifth surface;

a circuit board, located inside the first housing, including a communication circuit;

at least one antenna located inside the third housing; and at least one connection member electrically connecting the circuit board to the at least one antenna, wherein the at least one connection member has a first end in the first housing that is connected to the circuit board, the at least one connection passes through the first hinge, the second housing, and the second hinge, and the at least one connection member has a second end in the third housing that is connected to the at least one antenna, wherein the at least one connection member includes:

a first connection member corresponding to at least a portion of the at least one connection member that passes through the first hinge, the first connection member having a first physical property, and a second connection member corresponding to at least a portion of the at least one connection member that passes through the second hinge, the second connection member having a second physical property that is different than the first physical property, and wherein the first connection member and the second connection member each include a printed circuit board (PCB), a flexible printed circuit board (FPCB), a flat ribbon cable (FRC), or a coaxial cable.

2. The electronic device of claim 1, wherein the first hinge is an in-fold type hinge, and the second hinge is an out-fold type hinge.

3. The electronic device of claim 2, wherein a curvature of the flexible display corresponding to the first hinge is smaller than a curvature of the flexible display corresponding to the second hinge.

4. The electronic device of claim 1, wherein the first connection member includes a different one among the PCB, the FPCB, the FRC, or the coaxial cable than the second connection member includes.

5. The electronic device of claim 1, wherein at least one of the first connection member or the second connection member includes the coaxial cable.

6. The electronic device of claim 1, wherein the first connection member includes the FRC, and the second connection member includes the coaxial cable.

7. The electronic device of claim 1, further comprising:
- a third connection member disposed between the first connection member and the second connection member,
- wherein the third connection member includes the coaxial cable.

8. The electronic device of claim 1, wherein the at least one connection member includes the coaxial cable.

9. The electronic device of claim 1, further comprising:
- a first fixing member to fix the at least one connection member to the first housing at a position adjacent to the first hinge; and
- a second fixing member to fix the at least one connection member to the second housing at a position adjacent to the first hinge.

10. The electronic device of claim 9, further comprising:
- a third fixing member to fix the at least one connection member to the second housing at a position adjacent to the second hinge; and
- a fourth fixing member to fix the at least one connection member to the third housing at a position adjacent to the second hinge.

11. The electronic device of claim 1, further comprising:
- at least one antenna located adjacent to a side surface far from the second hinge inside the third housing.

12. The electronic device of claim 11, further comprising:
- at least one antenna located inside the first housing,
- wherein a distance between the at least one antenna located inside the third housing and the communication circuit is greater than a distance between the at least one antenna located inside the first housing and the communication circuit.

13. The electronic device of claim 1, wherein the first hinge includes a first shaft rotating around a first axis parallel to the first surface, and a second shaft rotatable around a second axis parallel to the first axis.

14. The electronic device of claim 1,
- wherein the first housing includes a first side surface between the first surface and the second surface and a second side surface facing in a direction opposite to the first side surface,
- wherein the second housing includes a third side surface connected to the first hinge and a fourth side surface facing in a direction opposite to the third side surface,
- wherein at least one antenna module located adjacent to a side surface far from the second hinge inside the third housing,
- wherein the third housing includes a fifth side surface connected to the second hinge and a sixth side surface facing in a direction opposite to the fifth side surface, and
- wherein the at least one antenna module is located adjacent to the sixth side surface inside the third housing.

15. The electronic device of claim 1,
- wherein the at least one connection member includes a coaxial cable, and
- wherein the electronic device further comprises:
  - a first fixing member to fix the coaxial cable to the first housing at a position adjacent to a first side of the first hinge,
  - a second fixing member to fix the coaxial cable to the second housing at a position adjacent to a second side of the first hinge opposite from the first side of the first hinge,
  - a third fixing member to fix the coaxial cable to the second housing at a position adjacent to a first side of the second hinge, and
  - a fourth fixing member to fix the coaxial cable to the third housing at a position adjacent to a second side of the second hinge opposite from the first side of the second hinge.

* * * * *